US008598708B2

(12) United States Patent
Dijon et al.

(10) Patent No.: US 8,598,708 B2
(45) Date of Patent: Dec. 3, 2013

(54) CARBON NANOTUBE-BASED INTERCONNECTION ELEMENT

(75) Inventors: Jean Dijon, Champagnier (FR); Philippe Pantigny, Claix (FR)

(73) Assignee: Commissariat a l'Energie Atomique, Paris (FR)

( * ) Notice: Subject to any disclaimer, the term of this patent is extended or adjusted under 35 U.S.C. 154(b) by 65 days.

(21) Appl. No.: 12/004,883

(22) Filed: Dec. 20, 2007

(65) Prior Publication Data

US 2008/0150152 A1    Jun. 26, 2008

(30) Foreign Application Priority Data

Dec. 21, 2006  (FR) ...................................... 06 55839

(51) Int. Cl.
*H01L 23/48* (2006.01)
*H01L 23/52* (2006.01)
*H01L 29/40* (2006.01)

(52) U.S. Cl.
USPC ........... 257/773; 257/758; 257/774; 257/776; 257/E23.011; 977/932

(58) Field of Classification Search
USPC .................. 257/773, 774, 758, 776, E23.011, 257/E23.145, E21.577, E21.578
See application file for complete search history.

(56) References Cited

U.S. PATENT DOCUMENTS

| | | | | |
|---|---|---|---|---|
| 4,577,923 A | * | 3/1986 | Ikemizu | 439/876 |
| 4,979,149 A | | 12/1990 | Popovic et al. | |
| 6,054,755 A | * | 4/2000 | Takamichi et al. | 257/667 |
| 6,148,900 A | * | 11/2000 | Yamasaki et al. | 164/80 |
| 6,211,561 B1 | * | 4/2001 | Zhao | 257/522 |
| 6,580,174 B2 | * | 6/2003 | McCormick et al. | 257/774 |
| 6,603,206 B2 | * | 8/2003 | Wang et al. | 257/774 |
| 6,661,094 B2 | * | 12/2003 | Morrow et al. | 257/758 |
| 6,667,552 B1 | * | 12/2003 | Buynoski | 257/758 |
| 7,004,994 B2 | * | 2/2006 | Hampden-Smith et al. | 75/351 |
| 7,078,811 B2 | * | 7/2006 | Suga | 257/758 |
| 7,084,479 B2 | * | 8/2006 | Chen et al. | 257/522 |
| 7,126,207 B2 | * | 10/2006 | Mosley et al. | 257/532 |
| 7,135,773 B2 | * | 11/2006 | Furukawa et al. | 257/758 |

(Continued)

FOREIGN PATENT DOCUMENTS

| | | |
|---|---|---|
| EP | 1 361 608 | 12/2003 |
| EP | 1521302 A1 | 4/2005 |

(Continued)

OTHER PUBLICATIONS

Kreupl, F., "Carbon Nanotubes for Interconnect Applications", Microelectron, Eng. 64, 2002, pp. 399-408.

(Continued)

*Primary Examiner* — Teresa M Arroyo
(74) *Attorney, Agent, or Firm* — Nixon Peabody LLP (57) ABSTRACT

An element to interconnect at least two conductors of a microelectronic circuit is disclosed that includes an initial conductor, referred to as lower conductor; a dielectric layer situated on the initial conductor; a second conductor, referred to as upper conductor, on the dielectric layer; a cavity in the dielectric layer emerging, on the one hand, on the lower conductor and, on the other hand, on the upper conductor. The upper conductor forms a bridge above the lower conductor and the cavity forms, at a level where it emerges on the upper conductor, two vents on both sides of the latter.

21 Claims, 8 Drawing Sheets

(56) References Cited

U.S. PATENT DOCUMENTS

| | | | |
|---|---|---|---|
| 7,304,357 B2 * | 12/2007 | Jaiprakash et al. | 257/415 |
| 7,352,607 B2 * | 4/2008 | Furukawa et al. | 365/151 |
| 7,535,016 B2 * | 5/2009 | Furukawa et al. | 257/20 |
| 7,586,196 B2 * | 9/2009 | Dubin et al. | 257/758 |
| 2003/0021966 A1 | 1/2003 | Segal et al. | |
| 2004/0124407 A1 * | 7/2004 | Kozicki et al. | 257/9 |
| 2004/0164419 A1 * | 8/2004 | Ahn et al. | 257/758 |
| 2004/0251551 A1 * | 12/2004 | Hideki | 257/758 |
| 2005/0087875 A1 * | 4/2005 | Furukawa et al. | 257/758 |
| 2005/0104056 A1 | 5/2005 | Nihei | |
| 2005/0142933 A1 | 6/2005 | Beer et al. | |
| 2005/0151260 A1 * | 7/2005 | Na | 257/758 |
| 2005/0236963 A1 * | 10/2005 | Kang et al. | 313/495 |
| 2005/0248907 A1 * | 11/2005 | Stevenson et al. | 361/306.2 |
| 2006/0006377 A1 * | 1/2006 | Golovchenko et al. | 257/39 |
| 2006/0038299 A1 * | 2/2006 | Hirakata et al. | 257/773 |
| 2006/0177990 A1 * | 8/2006 | Beyer et al. | 438/421 |
| 2006/0205211 A1 * | 9/2006 | Kirby | 438/667 |
| 2006/0220067 A1 | 10/2006 | Lieber et al. | |
| 2006/0261392 A1 * | 11/2006 | Lee et al. | 257/296 |
| 2006/0278901 A1 | 12/2006 | Dangelo et al. | |
| 2007/0018260 A1 * | 1/2007 | Jaiprakash et al. | 257/414 |
| 2007/0020919 A1 * | 1/2007 | Adem et al. | 438/629 |
| 2007/0045756 A1 * | 3/2007 | Chang et al. | 257/414 |
| 2007/0148963 A1 * | 6/2007 | Chan et al. | 438/637 |
| 2007/0205450 A1 * | 9/2007 | Okita | 257/296 |
| 2007/0252282 A1 * | 11/2007 | Anderson et al. | 257/774 |
| 2008/0029909 A1 * | 2/2008 | Hijzen et al. | 257/784 |
| 2009/0057912 A1 * | 3/2009 | Kheng | 257/774 |
| 2009/0096109 A1 * | 4/2009 | Iwasaki | 257/774 |

FOREIGN PATENT DOCUMENTS

| | | |
|---|---|---|
| JP | 2001-217312 | 8/2001 |
| JP | 2003-273112 | 9/2003 |
| JP | 2005-123607 A | 5/2005 |
| WO | WO 01/61753 | 8/2001 |
| WO | 2006/043329 A1 | 4/2006 |

OTHER PUBLICATIONS

European Search Report for European Application No. 07 12 3467, dated May 21, 2008.

Office Action for Japanese Application No. 2007-320949 dated Jan. 22, 2013.

* cited by examiner

CARBON NANOTUBE-BASED INTERCONNECTION ELEMENT

CROSS REFERENCE TO RELATED APPLICATIONS OR PRIORITY CLAIM

This application claims priority to French Patent Application No. 06 55839, filed Dec. 21, 2006.

BACKGROUND

1. Technical Domain

The present invention concerns the domain of microelectronics and more specifically, that of interconnection elements within an integrated circuit.

2. Prior Art

The electrical connections between two different plans of an integrated circuit are conventionally implemented through via holes. A via hole can be considered as a hole traversing an insulation layer separating a lower conductive layer and an upper conductive layer, this hole being filled with a metal, typically copper, to ensure the electrical connection between both layers.

This type of connection is satisfactory for micrometric interconnection means. However, for designs with smaller lateral dimensions, there is the constraint of utilizing via holes of diameter less than 100 nm or even 50 nm. The height/diameter ratio of the hole thus becomes high, making the metallic deposit particularly delicate due to the fact that the hole in question is prone to partial blockage in its upper section before eventually becoming completely filled. In addition, the smaller the diameter of the via hole, the more sensitive the electromigration phenomena become, thereby reducing both the maximum current that can be flown and the lifespan of the connection. Finally, the reduction in the diameter of the via holes results in an increased interconnection resistance, which reduces the maximum functional speed of the integrated circuit by the same extent.

To overcome the aforementioned drawbacks, it was proposed to replace the metal via holes by an array of carbon nanotubes. Due to their excellent conductive properties, and their mechanical and thermal stability, carbon nanotubes are indeed well suited for use for via holes of very small dimensions. Such a via hole is described, for example, in the WO 01/61753 application.

Figure 1:
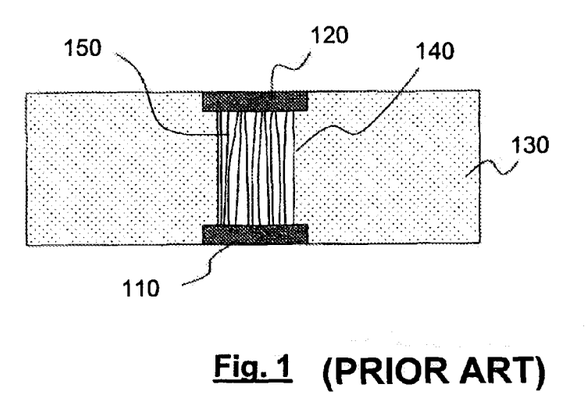
FIG. 1 shows an interconnection element known in the art.

FIG. 1 illustrates a via hole using nanotubes known in the art. For reasons of simplification, the substrate has not been shown.

The via hole provides the connection between a lower conductor 110 and an upper conductor 120, separated by a dielectric layer 130. The hole 140 contains carbon nanotubes (CNT) 150, extending from the lower conductor to the upper conductor.

The CNT are made via catalytic synthesis. More precisely, a catalyst (typically using nickel nanoparticles) is deposited on the lower conductor in order to initiate the CNT formation during a chemical deposition phase in a vapour phase (CVD). The CNT subsequently grows from the lower conductor to the upper conductor. The catalyst deposit must be localised in the bottom of the via hole. By contrast, if a catalyst is deposited on the walls of the hole, this enhances the lateral growth of CNT, which disrupts or even prevents the growth of the vertical array, the only effective participant in the electrical connection between the lower and upper conductors. Preventing deposition on the walls of the hole is even more vital when the diameter is small.

In order to avoid parasitic lateral growth of the CNT, it was proposed in the article by F. Kreupl entitled "Carbon Nanotubes for Interconnect Applications" published in Microelectron. Eng. 64, pages 399-408, 2002, to initially proceed with the deposition of a catalyst on the lower conductor before proceeding with the deposition of the dielectric layer. The hole is subsequently etched up to the catalyst area before causing the CNT to grow. Implementing this technique is very delicate, since it requires the etching process to be stopped on a catalyst layer with a thickness of several nanometers. Moreover, the physicochemical properties of the catalyst layer may be impacted by the phases of deposition and etching of the dielectric layer, and its catalytic activity may consequently be significantly affected.

Whatever the mode of catalyst deposition selected, it involves making the CNT grow from the lower conductor, and generally speaking, the next step involves proceeding to chemical mechanical planarisation (CMP). The upper conductor is subsequently deposited on the planarised surface.

The main difficulty arising with this technique is obtaining ohmic contact between the CNT and the lower and upper conductors. The deposition of the upper conductor is performed at a relatively low temperature and annealing would burden the thermal budget of the integrated circuit.

A first object of the present invention is to realise a carbon nanotube-based interconnection element presenting good electrical contact between the nanotubes and the conductors to be interconnected.

A second object of the present invention is to limit or significantly reduce the lateral growth of the CNT without risking to damage to catalyst layer.

A third object of the present invention is to get rid of the polishing step after the growth of the carbon nanotubes.

DISCLOSURE OF INVENTION

The present invention is defined by an element designed to interconnect at least two conductors of a microelectronic circuit, comprising:
- a first conductor, referred to as lower conductor;
- a dielectric layer on said first conductor;
- a second conductor, referred to as upper conductor, on said dielectric layer;
- a cavity in the dielectric layer, emerging on the one hand onto the lower conductor and, on the other hand onto the upper conductor; in which the upper conductor forms a bridge above the lower conductor and the cavity forms at a level where it emerges onto the upper conductor, two vents on both sides of the latter.

According to a first embodiment, said element includes a catalyst layer, promoting the growth of the carbon nanotubes, on the upper face of said lower conductor.

In this case, it may also include a diffusion barrier layer between the upper face of the lower conductor and the catalyst layer.

According to a variant, it includes a layer for inhibiting the growth of carbon nanotubes, said inhibition layer being deposited on the catalyst layer, the area deposited covering a zone that corresponds substantially to the orthogonal projection of the vents onto the latter.

An electrically conductive array of nanotubes is subsequently formed in the cavity, said array extending from the catalyst layer to the lower face of the upper conductor.

Advantageously, an electrical contact layer may be situated directly under the upper conductor.

According to a second embodiment of the invention, said element includes a catalyst layer, promoting the growth of the carbon nanotubes, on the lower face of said upper conductor.

In this case, it may also include a diffusion barrier layer between the lower face of the upper conductor and the catalyst layer.

An electrically conductive array of nanotubes is subsequently formed in the cavity, said array extending from the catalyst layer to the upper face of the lower conductor.

Advantageously, an electrical contact layer may be situated directly under the upper conductor.

In this specific case, an array of carbon nanotubes may be formed in the cavity, said array extending from the catalyst layer to the electrical contact surface.

The constitutive material of the electrical contact layer may be palladium or nickel.

The constitutive material of the diffusion barrier layer may be titanium, titanium nitride, tantalum or tantalum nitride.

The catalyst layer may include nickel-based metallic nanoparticles, a nickel-palladium alloy, iron, yttrium, platinum, or cobalt.

The carbon nanotubes may include single or multi-wall type nanotubes.

The constitutive material of the lower conductor and/or the upper conductor may be copper, aluminium, nickel silicide or cobalt silicide.

The invention also concerns a method of manufacturing an element designed to interconnect at least two conductors of a microelectronic circuit, including:

a step of realising a first conductor, referred to as lower conductor;

a step of realising a layer of first dielectric on the lower conductor;

a step of realising a second conductor, referred to as upper conductor, on said dielectric layer;

a step of realising a cavity, emerging, on the one hand, onto the lower conductor and, on the other hand, onto the upper conductor, in which the upper conductor forms a bridge above the lower conductor and the cavity forms at a level where it emerges onto the upper conductor two vents on both sides of the latter.

According to a first embodiment, the method includes the following steps:

realising the design of the lower conductor in a layer of said dielectric using a damascene-type technique;

deposition of a layer of catalyst promoting carbon nanotube growth, preceded or not by the deposition of a diffusion barrier layer;

deposition of the first dielectric and etching of a cavity therein emerging onto the catalyst layer;

filling of said cavity by the deposition of a second dielectric;

realisation of the upper conductor in the second dielectric using a damascene-type technique;

selective etching of the second dielectric.

Preferably, the selective etching step of the second dielectric should be followed by the direct deposition of a layer for inhibiting the growth of carbon nanotubes, such that said inhibition layer covers the interior of said cavity, with the exception of a zone at the bottom of the cavity facing the lower face of the upper conductor.

Advantageously, the electrical contact layer is deposited after the deposition of the second dielectric and before the realisation of the upper conductor.

According to a second embodiment, the method includes the following steps:

realisation of the first conductor design in a layer of said dielectric using a damascene-type technique;

deposition of the first dielectric layer and etching of a cavity therein emerging onto the lower conductor;

filling of said cavity by the deposition of a second dielectric;

realisation of a catalyst layer promoting growth of carbon nanotubes as well as of the upper conductor in the second dielectric via a damascene-type technique;

selective etching of the second dielectric.

Preferably, the realisation of the catalyst layer should be following by the deposition of a diffusion barrier layer.

Advantageously, the catalyst layer and, where applicable, the diffusion barrier layer, is/are deposited through a hard mask forming an overhang above the etching sidewalls defining the pattern of the upper conductor.

The electrical contact layer is deposited directly onto the lower conductor, before the deposition of the dielectric layer.

The method may subsequently include a step of growth of the carbon nanotubes from the catalyst layer.

After said step of growth of nanotubes, it is advantageous to proceed to the deposition of a second layer of dielectric material covering the upper conductor and which is planarised by polishing the structure thus obtained until the upper conductor is visible at the surface of said structure.

The steps of the aforementioned method can be iterated, the upper conductor of a current iteration playing the role of lower conductor for the following iteration.

BRIEF DESCRIPTION OF THE DRAWINGS

Further characteristics and advantages of the invention will be apparent upon reading of a preferred embodiment of the invention made with reference to the attached figures among which.

DETAILED OUTLINE OF SPECIFIC EMBODIMENTS

The basic concept of the invention is to achieve an interconnection element with a bridge structure above a cavity made in the dielectric layer, said cavity emerging, on the one hand, onto the lower conductor and forming, on the other hand, vents on both sides of the upper conductor.

In a general manner, the invention allows the realisation of an element designed to interconnect at least two connectors of a microelectronic circuit. The element is subsequently placed into a reactor in which the growth of carbon nanotubes is then carried out.

It is important to understand that the structure of the element either before or after the CNT growth phase is part of the present invention.

Figure 2A:
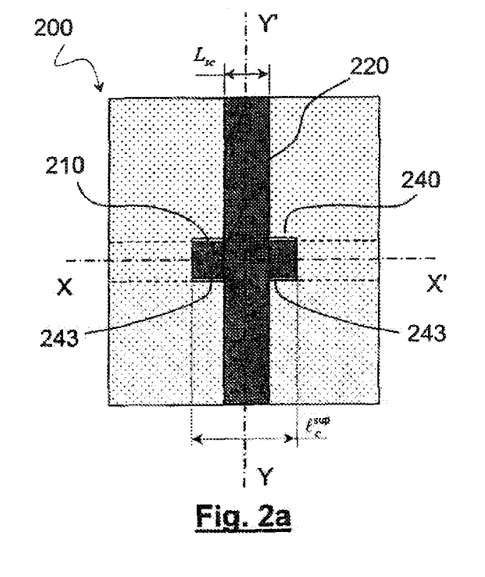
FIGS. 2a to 2c show the general structure of an interconnection element according to the invention, before the growth phase of the carbon nanotubes.
Figure 2B:
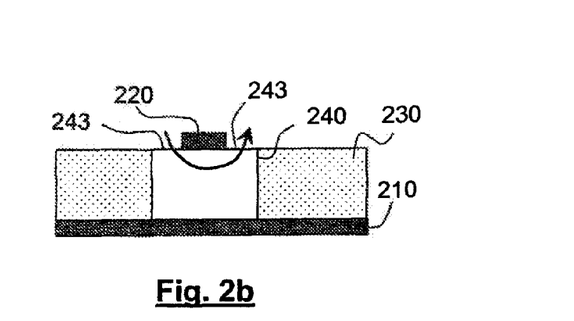
Figure 2C:
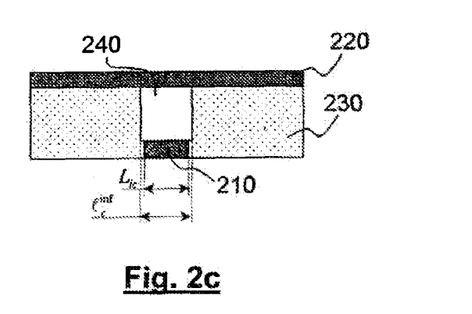

FIG. 2a shows a top view of the interconnection element, before the CNT growth phase. FIGS. 2b and 2c respectively show cross sections of the same element along the XX' axis of the lower conductor and along the YY' axis of the upper conductor.

For reasons of simplification, the substrate has not been shown on FIGS. 2a to 2c, and this will also apply to subsequent figures.

The interconnection element 200 includes a lower conductor 210, here having the form of a conductive line. The lower conductor is covered by a dielectric layer 230, on which the upper conductor 220 is situated, likewise here shown in the form of a conductive line orthogonal to the first. It should however be clear that the invention is not limited to orthogonal conductive lines. The conductors may notably present more complex designs or patterns, connected or otherwise, as well as non-orthogonal intersections while remaining within the scope of the present invention. The lower conductors are, for example, the metallic layers of Cu or Al. The dielectric layer 230 is, for example, of $SiO_2$ or $Si_3N_4$ or even SiOC.

A cavity 240 is accommodated in the dielectric layer 230 such that it emerges, on the one hand, onto the lower conductor 210 and, on the other hand, onto the upper conductor. The upper conductor 220 forms a bridge above the cavity and the lower conductor. This cavity forms, at a level where it emerges onto the upper face of the oxide, two vents 243 on both sides of the upper conductor 220. To do so, the dimension $l_c^{sup}$ of the cavity, taken according to an orthogonal axis on the upper conductor, at the interconnection point P, within the plane of the upper face of the oxide, is selected to be significantly greater than the width $L_{sc}$ of this conductor.

The size of vents 243 is selected to be sufficiently large to allow the free circulation of a flow of gas in the cavity, under the upper conductor, as indicated by the arrow in FIG. 2b.

Advantageously, at the interconnection point P, the dimension $l_c^{inf}$ of the cavity, taken according to an orthogonal axis of the lower conductor, at a level where it emerges onto the latter, is selected as slightly larger than the width $L_{ic}$ of the conductor, such that the entire width of its upper face is cleared at the bottom of the cavity.

Figure 3A:
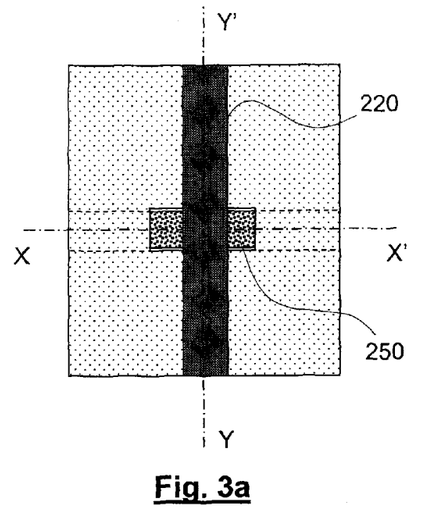
FIGS. 3a and 3b schematically illustrate an interconnection element according to an initial embodiment of the invention.
Figure 3B:
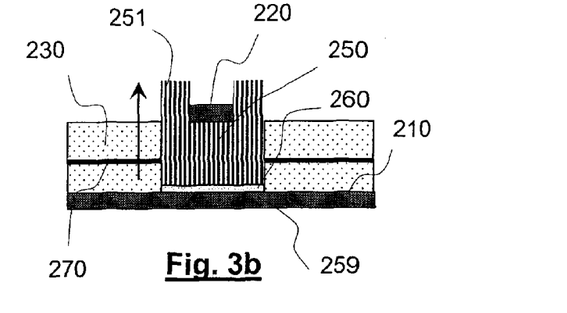

FIGS. 3a and 3b show an interconnection element according to a first embodiment of the invention. FIG. 3a, shows the upper view of said element, after the CNT growth phase. FIG. 3b shows the cross section of this element along the XX' axis.

In this embodiment, a catalyst layer 260 was deposited on the upper face of the lower conductor 210 at the bottom of the cavity 240. Advantageously, a barrier layer 259 would be deposited beforehand on the catalyst layer, thereby avoiding the diffusion of the catalyst into the lower conductor. The vents 243 located on both sides of the upper conductor allow the circulation of gases during the catalytic synthesis phase of the CNT. The nanotubes 250 initiate on the upper face of the lower conductor and freely grow until they come into contact with the lower face of the upper conductor. At the level of vents 243, the growth of the nanotubes takes place on the dielectric layer 230, on each side of the upper conductor 220, as indicated in 251. The CNT overhang in 251 can be eliminated by an additional facultative step of planarisation. This step will be necessary if multiple levels of interconnection are desired, as will be revealed later.

Figure 4A:
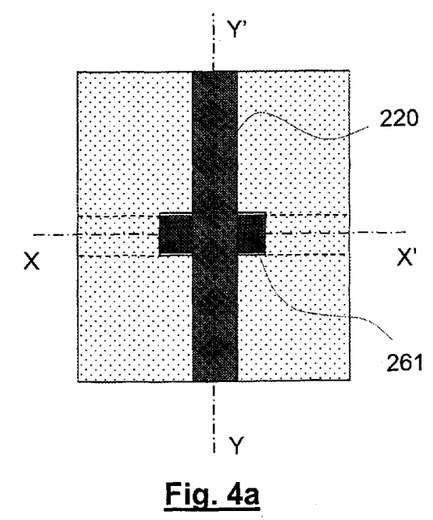
FIGS. 4a and 4b schematically illustrate an interconnection element according to a second embodiment of the invention.
Figure 4B:
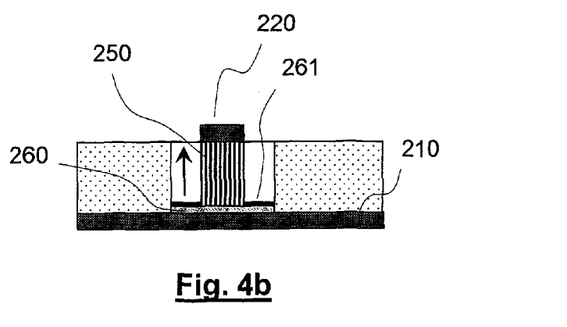

FIGS. 4a and 4b show an interconnection element, according to a second embodiment of the invention. As previously, FIG. 4a shows the upper view of said element, after the CNT growth phase and FIG. 4b shows the cross section of this element along the XX' axis.

This second embodiment differs from the first in that the catalyst layer 260 is partially coated with a protective or inhibition layer 261. More precisely, this inhibition layer covers an area of the catalyst layer 260 significantly corresponding to the orthogonal projection of the vents onto the bottom of the cavity. In this way, the CNT growth is inhibited over the vents, which limits the CNT growth to the zones facing the upper conductor and the lower conductor. Likewise, the circulation of gases is consequently facilitated, which significantly boosts CNT growth in the cavity.

Figure 5A:
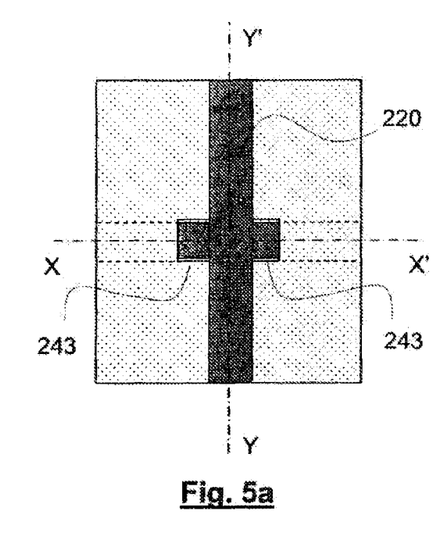
FIGS. 5a and 5b schematically illustrate an interconnection element according to a third embodiment of the invention.
Figure 5B:
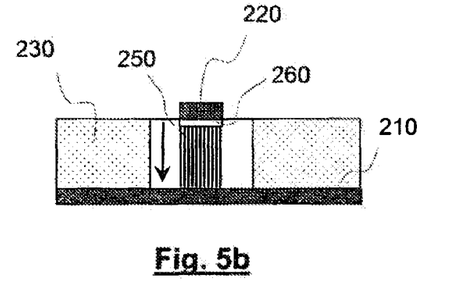

FIGS. 5a and 5b show an interconnection element according to a third embodiment of the invention. As previously, FIG. 5a shows the upper view of said element, after the CNT growth phase, and FIG. 5b shows the cross section of this element along the XX' axis.

This preferred embodiment differs from the previous ones in that the catalyst layer 260 is located on the lower face of the upper conductor 220. The CNT growth consequently takes place from this surface, until the nanotubes come into contact with the upper face of the lower conductor 210. It should be noted that this embodiment does not result in parasitic lateral growth without requiring the deposition of an inhibition layer. Moreover, the vents 243 allow a circulation of gases during the entire growth phase. Advantageously, a layer allowing an improved electrical contact between the nanotubes and the lower conductor may be deposited directly on the surface of the latter.

According to a fourth embodiment of the invention (not shown), the catalyst layer is deposited both on the upper face of the lower conductor 210 as in the first or second embodiment, and on the lower face of the upper conductor 220, as in the third embodiment. The growth of the nanotubes therefore takes place in two opposite directions. More specifically, a first array of CNT grows from the upper face of the lower conductor towards the lower face of the upper conductor whereas a second array of CNT grows from the lower face of the upper conductor towards the upper face of the lower conductor. This embodiment leads to a higher density of CNT in the cavity and therefore improves the connection quality.

According to a variant of the first to fourth embodiments, the dielectric layer 230 may include an embedded conductive layer, e.g. a metallic layer. This conductive layer has been represented by way of example in FIG. 3b, i.e. for the first embodiment. By adequately polarising this conductive layer 270, the conductivity of the CNT can be increased.

FIGS. 6a to 6j show the steps of the method used to manufacture the interconnection element according to the second embodiment of the invention. The method used to manufacture an interconnection element according to the first embodiment will not be explicitly described to avoid repetition. Details of how it differs from the second embodiment will be detailed below.

On each one of FIGS. 6a to 6j, a cross section of the interconnection element along the XX' axis of the lower conductor has been shown on the left, a cross section along the YY' axis of the upper conductor has been shown on the right.

The first step of the method consists in depositing an insulation layer A, referenced 230, on the substrate (not shown) and to realise the lower conductor 210 inside the insulation layer. To do this, a damascene-type technique is used, well known in the art: conductive patterns are etched into the insulation layer then filled with metal, for example copper. The upper face of the insulation layer is subsequently polished to obtain the structure shown in FIG. 6a. Here, it is constituted of a conductive line 210 formed in the insulation layer 230.

The next step is the deposition of the catalyst layer 260 on the lower conductor 210. For so doing, a sacrificial layer 263 is deposited beforehand on the lower conductor and a hard mask 265, delimiting the catalyst design. The etching is carried out by lithography (for example by an electron beam). The result after deposition of the catalyst is shown in FIG. 6b.

Advantageously, a barrier layer of 10 to 50 nm (not shown) is deposited before the catalyst layer, on the lower conductor. The barrier layer can be realised for example with titanium (Ti), titanium nitride (TiN), tantalum (Ta), tantalum nitride (TaN) or aluminium (Al).

The choice of the catalyst depends on the type of CNT which is desired to be grown. In general, metallic particles are used (nickel, cobalt, iron, yttrium, platinum, etc. or an alloy of the aforementioned materials). In certain cases, the barrier layer is not necessary.

By way of example, to preferably create nanotubes of the multi-wall type (MWCNT), the following is selected:
 a layer of nickel 3 nm in thickness deposited on a carrier layer of TiN or TaN (for example of 10 nm);
 a nickel-palladium alloy $Pd_{0.25}Ni_{0.75}$ of thickness 3 nm;
 a bi-layer in which each layer is defined by (10 nm of Al, 3 nm of Ni), directly deposited on the copper (first or second conductor);
 a bi-layer in which each layer is defined by (5 nm of Si, 3 nm of Fe).

Conversely, if nanotubes the single-wall type (SWCNT) are preferred, the following is selected:
 a bi-layer in which each layer is defined by (20 of Al, 0.5 nm of Fe, 0.2 of Al);
 a bi-layer in which each layer is defined by (5 nm of Si, 0.5 nm of Fe),
 a bi-layer in which each layer is defined by (3 nm of Si, 1 nm of Co). Those skilled in the art will be able to adapt the thicknesses of the catalyst to obtain a given mixture of both single- and multi-wall type nanotubes.

After the deposition of the catalyst, the sacrificial layer 263 is subsequently eliminated and a new insulation layer A is deposited. A cavity 240 is then opened up in this insulation layer using a chemical or reactive etching process (RIE). The profile of the etching can be advantageously chosen as an inclined slope as shown in FIG. 6c. The etching stops on the catalyst layer.

The cavity is then filled with a second insulator B, shown in 235, before subsequently proceeding with the planarisation of the upper face to obtain the structure shown in FIG. 6d.

Figure 6A:
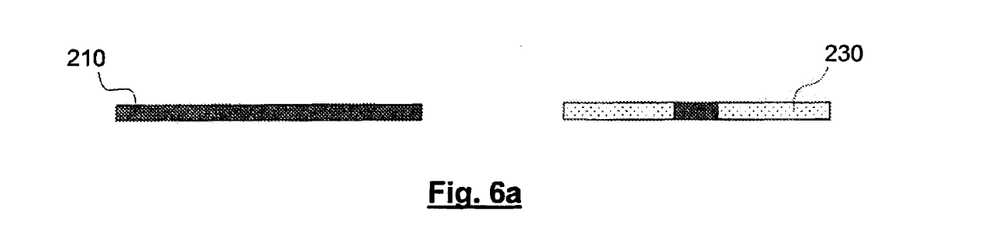
FIGS. 6a to 6j show a method of manufacturing the interconnection element according to the second embodiment of the invention.
Figure 6B:
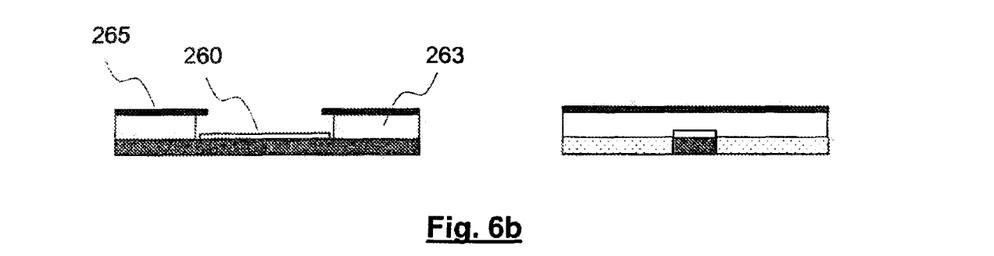
Figure 6C:
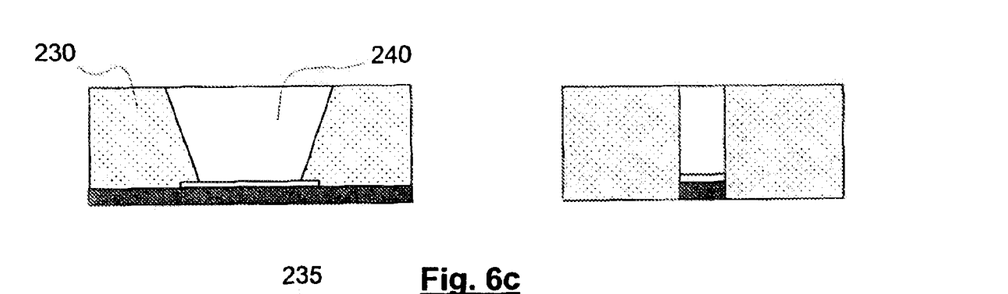
Figure 6D:
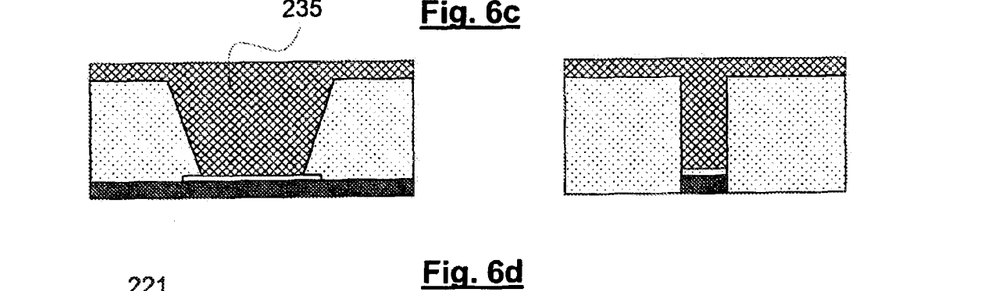
Figure 6E:
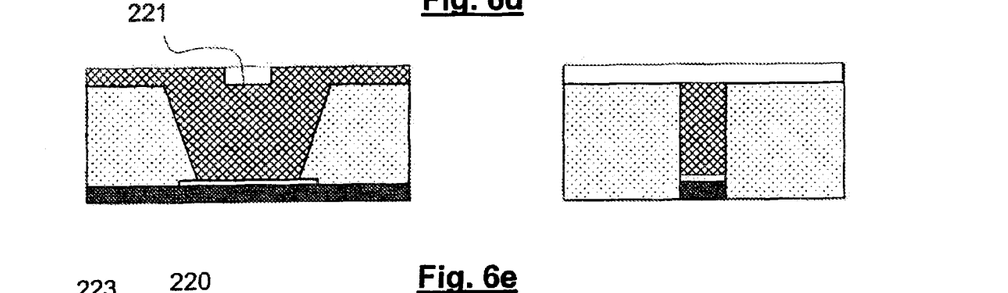
Figure 6F:
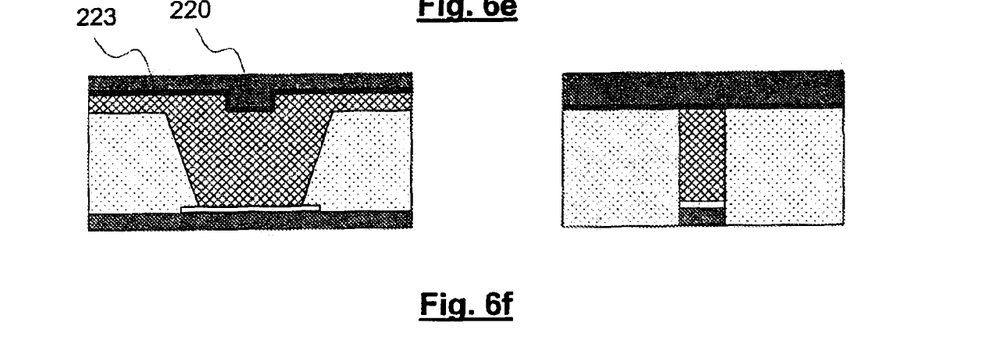
Figure 6G:
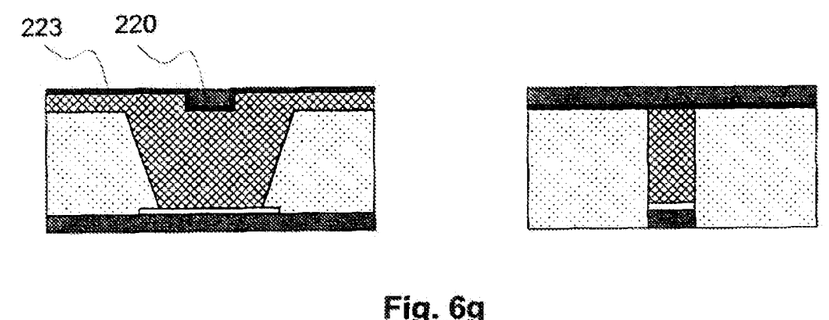

The upper conductor is then realised in the insulator B by a damascene-type method, shown in FIGS. 6e to 6g.

More precisely, the designs 221 of the upper conductor (here a simple conductive line according to the YY' axis) are etched in the insulator B. The etching stops at the interface with the insulator A. The result of the etching is shown in FIG. 6e.

Subsequently, a contact layer 223 is deposited, for example of palladium or titanium, then the upper conductor 220, of copper for example. The result of the operation is shown in FIG. 6f.

The upper face is planarised by a CMP planarisation until the designs of the upper conductor become apparent, here a simple conductive line, as shown in FIG. 6g.

Figure 6H:
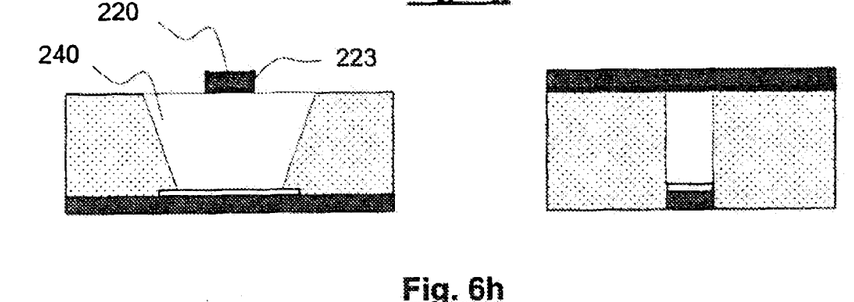
Figure 6I:
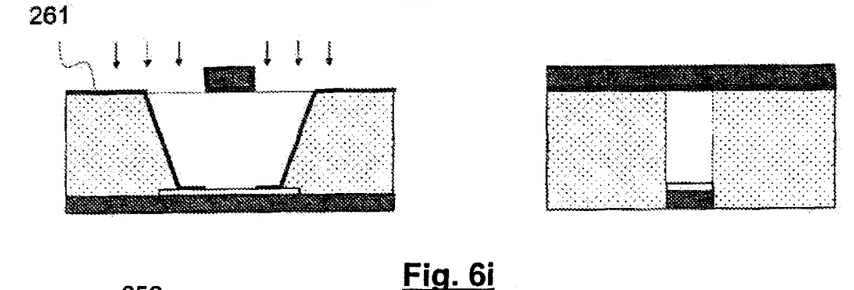

The complete etching of insulator B then takes place, which results in the cavity 240 as shown in FIG. 6h. A protective layer 261 is then deposited using a directional deposition technique. The protective layer is advantageous but need not necessarily consist of the insulator A material. The result of the operation is shown in FIG. 6i.

Figure 6J:
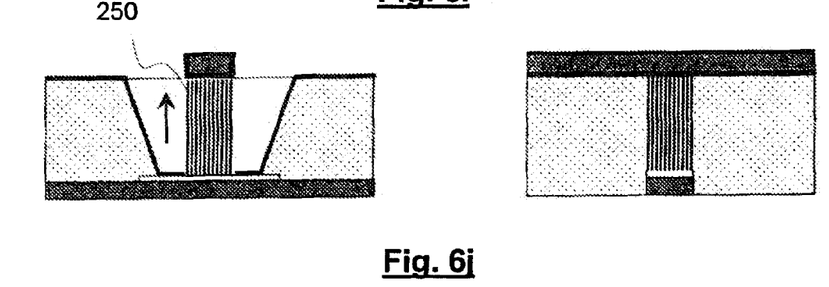

Finally, the carbon nanotubes are grown. Since the catalyst is situated on the lower conductor, the growth takes place upwards from the bottom. The final result is shown in FIG. 6j.

The growth method depends on the CNT type growth that is desired, namely, where multi-wall type nanotubes are preferred:
 the temperature is increased up to 540° C. in 10 nm in a reactor under 0.4 mBar of $H_2$;
 the reactor enclosure is emptied;
 the CNT are grown at 540° C. under 0.4 mBar of $C_2H_2$;
 the temperature is reduced during exposure to a flow of $H_2$ or He, in such a way as to rapidly cool the device.

Where single-wall nanotubes are preferred:
 the temperature is increased up to 700° C. in a reactor under 0.4 mBar of $H_2$;
 the reactor enclosure is emptied;
 the CNT at 700° C. under an atmosphere with a mixture of $C_2H_2$, $H_2$, He at 0.4 mBar with a flow of $C_2H_2$ of 5 sccm, $H_2$ 50 sccm and He 50 sccm.

Those skilled in the art will be capable of adapting the thicknesses of the catalyst to obtain a given mixture of NWCNT and SWCNT.

It should be noted that the method used to manufacture the interconnection element according to the first embodiment differs from that outlined above only in the omission of the deposition of the protective layer (see FIG. 6i).

FIGS. 7a to 7i show the steps of the method used to manufacture the interconnection element according to the third embodiment of the invention.

Figure 7A:
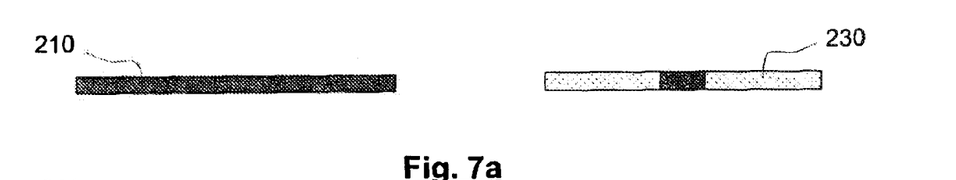
FIGS. 7a to 7i show a method of manufacturing the interconnection element according to the third embodiment of the invention.
Figure 7B:
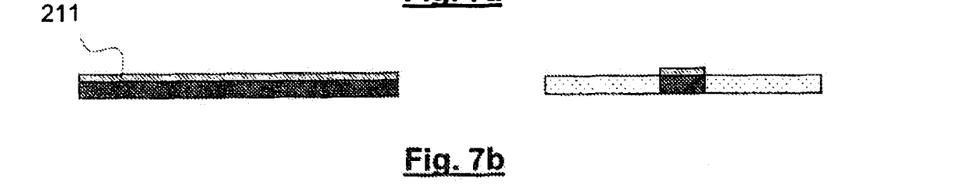

The first step, see FIG. 7a, is identical to that described in relation to FIG. 6a, namely in the formation of the initial conductor 210 in the dielectric layer A, shown in 230, by using a damascene-type method.

Subsequently, optionally but preferably, a contact layer 211, for example of palladium or titanium is deposited by electrochemical means onto the lower conductor, for example copper. The result of the deposition can be seen in FIG. 7b.

Figure 7C:
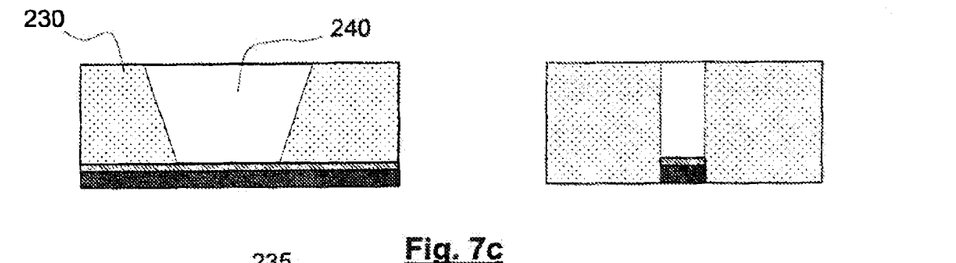
Figure 7D:
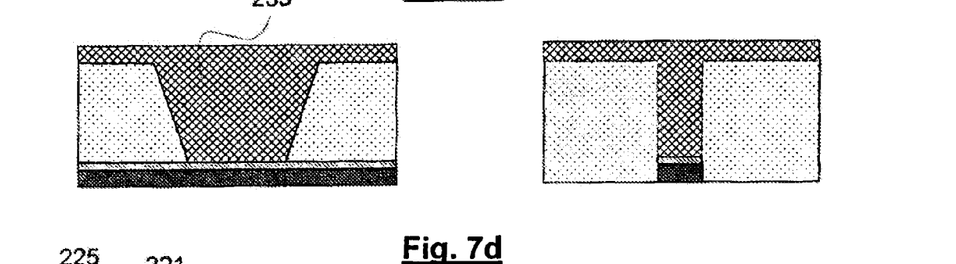

The next step involves the deposition of an insulation layer A, as shown in FIG. 7c, followed by the opening of a cavity 240 above the lower conductor. The etching of the cavity should advantageously be made according to an inclined slope and stop at the level of the contact layer, see FIG. 7c.

The cavity is then filled by a second insulator B, referred to as 235. The upper face is planarised by CMP to obtain the profile shown in FIG. 7d.

Figure 7E:
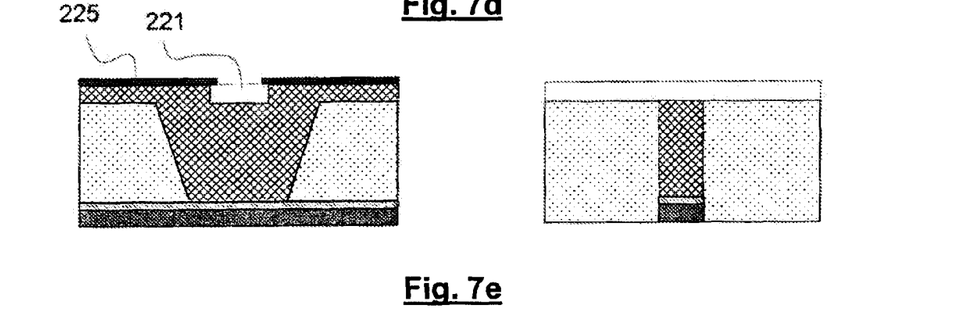

A hard mask 225 is then deposited onto the insulator B and the patterns 221 of the upper conductor here a simple conductive line in the YY' axis) are etched (in this insulator, as shown in FIG. 7e. The etching is stopped at the level of the insulator A. The hard mask allows a "cap" to be made, overhanging the edges of the etching.

Figure 7F:
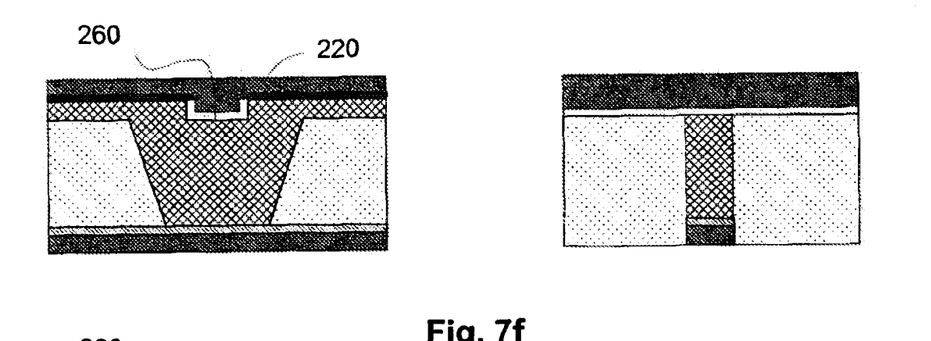

The next step involves the deposition of the catalyst layer 260, followed by, if applicable, by that of a barrier layer (not shown). The materials used for the catalyst and the barrier layer are the same as those mentioned for the second embodiment. The cap-shaped hard mask helps to avoid the deposition of catalyst on the edges of the etching. Subsequently, the upper conductor is deposited, preferably copper. The result of this step is shown in FIG. 7f.

Figure 7G:
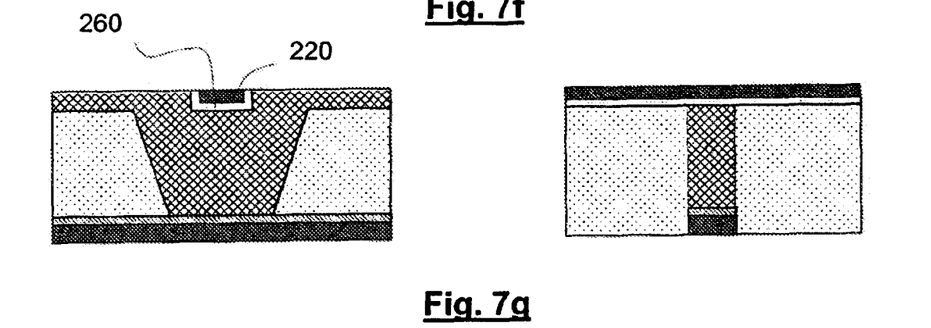

Subsequently, the upper face is planarised by CMP in order to reveal the surface of the patterns of the upper conductor at the surface of insulator B. The result of the planarisation is shown in FIG. 7g.

Figure 7H:
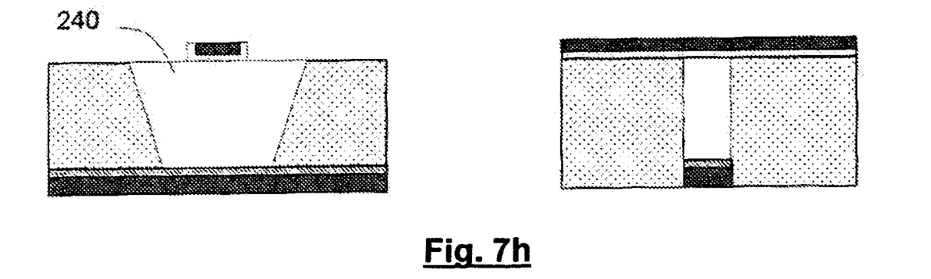
Figure 7I:
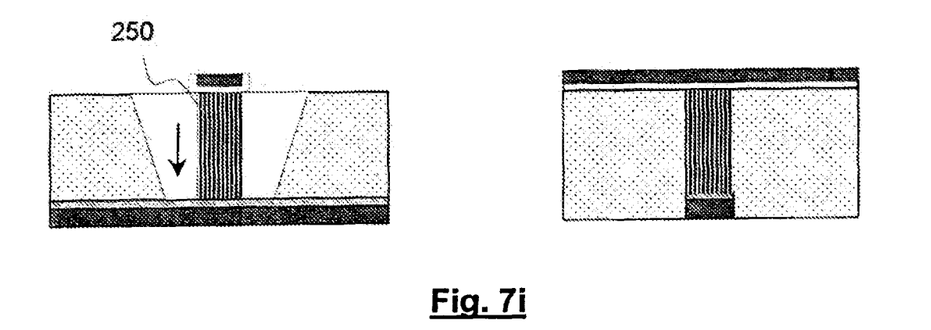

The next step is the complete etching of insulator B, which reveals the cavity 240. The bridge-shaped structure is thus obtained, as shown in FIG. 7h.

Finally, the CNT 250 are grown in the same conditions as those aforementioned for the second embodiment. Of course, here the growth takes place from the lower face of the upper conductor until the nanotubes come into contact with the contact layer 211 (or in the absence of the contact layer, the lower conductor 210). This completes the structure shown in FIG. 7i.

In the embodiments described above, the insulator or dielectric A can be silicon or a material with a low dielectric coefficient (low k dielectric), widely used in microelectronics. Insulator B can advantageously be hydrogenated silsesquioxane (HSQ) or a silicon nitride. Insulators A and B are selected in order to allow the etching of B with outstanding selectivity compared to A.

Figure 8A:
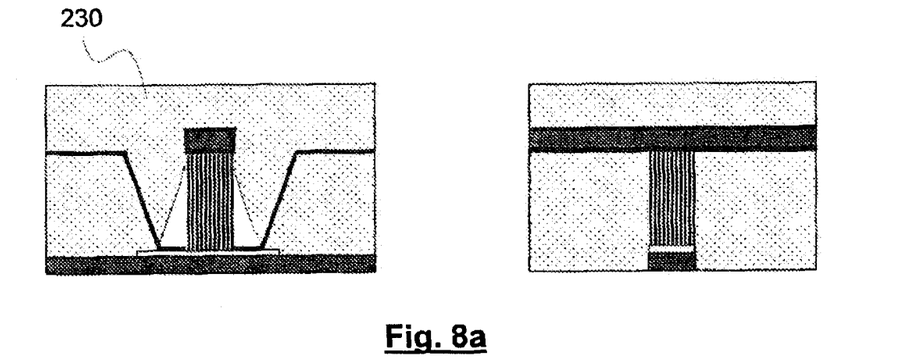
FIGS. 8a and 8b show the application of the interconnection element according to the invention for realising several levels of interconnection.
Figure 8B:
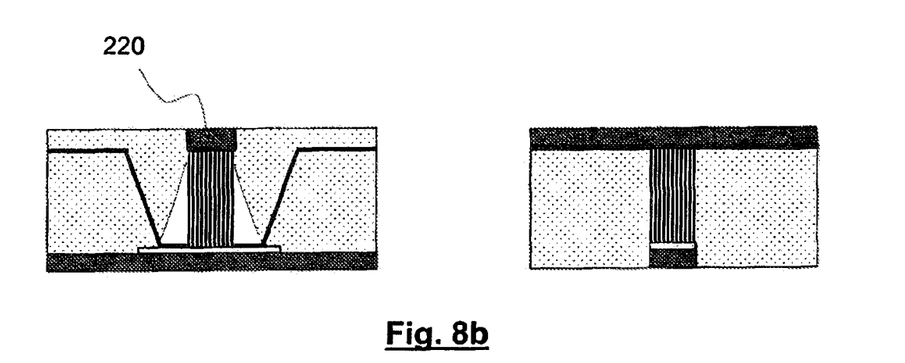

The interconnection element according to the invention can be used to realise several levels of interconnection. To do so, starting from the structure shown in FIG. 6i or 7h, an insulation layer A is further deposited, referred to in 230, to cover the upper conductor, as shown in FIG. 8a. The upper face is then planarised by CMP polishing, until the upper conductor is reached, i.e. until the design shown in FIG. 8b is obtained. The upper conductor 220 can therefore play the role previously played by the lower conductor 210 at the start of the process. In other words, the sequence made up of the steps of FIGS. 6a-6j or FIGS. 7a-7i, followed by those of FIGS. 8a and 8b can be iterated so as to connect several levels of a microelectronic circuit.

The connection element according to the invention is notably applicable for realising via holes of very small diameter for VLSI integrated circuits. It also enables realising the first level of interconnection in transistors. In this case, the lower conductor is a source electrode, a drain electrode or a gate electrode, for example made up of nickel or cobalt silicide.

The invention claimed is:

1. Element for interconnecting at least two conductors of an integrated microelectronic circuit, comprising:
    a lower conductor;
    an upper conductor forming a bridge above the lower conductor;
    a dielectric layer on said lower conductor, the dielectric layer having a cavity between a top portion of the dielectric layer and the lower conductor, the cavity having a first length dimension;
    said cavity extending between the lower conductor and the upper conductor to at least partially the top portion of the dielectric layer and the upper conductor being positioned at least partially above the cavity,
    a plurality of vents on lateral sides of the upper conductor at the top portion of the dielectric layer, wherein the upper conductor has a second length dimension, such that the first length dimension is larger than the second length dimension to define the vents, and wherein the vents are arranged in communication with the cavity so that gas can pass into and out of the cavity.

2. Element according to claim 1, characterized in that it includes a catalyst layer favoring the growth of carbon nanotubes, on an upper face of said lower conductor.

3. Element according to claim 2, characterized in that it includes a diffusion barrier layer between the upper face of the lower conductor and the catalyst layer.

4. Element according to claim 2, characterized in that it includes a layer for inhibiting the growth of carbon nanotubes, said inhibition layer being deposited on the catalyst layer, the former layer covering a zone corresponding to an orthogonal projection of the vents on the latter.

5. Element according to claim 2, characterized in that it includes an array of electrically conductive nanotubes in the cavity, said array being formed on the catalyst layer and extending therefrom to a lower face of the upper conductor.

6. Element according to claim 2, characterized in that it includes an electrical contact layer directly under the upper conductor, the upper conductor being deposited on the electrical contact layer.

7. Element according to claim 1, characterized in that it includes a catalyst layer, favouring the growth of carbon nanotubes, on a lower face of said upper conductor.

8. Element according to claim 7, characterized in that it includes a diffusion barrier layer between the lower face of the upper conductor and the catalyst layer.

9. Element according to claim 7, characterized in that it includes an array of carbon nanotubes in the cavity, said array being formed on the catalyst layer and extending therefrom to an upper face of the lower conductor.

10. Element according to claim 7, characterized in that it includes an electrical contact layer deposited on the lower conductor.

11. Element according to claim 6, characterized in that it includes an array of carbon nanotubes in the cavity, said array being formed on the catalyst layer and extending therefrom to the electrical contact layer.

12. Element according to claim 6, characterized in that the constitutive material of the electrical contact layer is palladium or nickel.

13. Element according to claim 3, characterized in that the constitutive material of the diffusion barrier layer is titanium, titanium nitride, tantalum or tantalum nitride.

14. Element according to claim 1, characterized in that it comprises a first catalyst layer, favouring the growth of carbon nanotubes, on an upper face of said lower conductor and a second catalyst layer on a lower face of said upper conductor.

15. Element according to claim 2, characterized in that said catalyst includes nickel-, nickel-palladium alloy-, iron-, yttrium-, platinum-, or cobalt-based metallic nanoparticles.

16. Element according to claim 5, characterized in that the carbon nanotubes include single-wall type nanotubes.

17. Element according to claim 5, characterized in that the carbon nanotubes include multi-wall type nanotubes.

18. Element according to claim 2, characterized in that the constitutive material of the lower conductor and/or the upper conductor is copper, aluminum, nickel or cobalt silicide.

19. Element according to claim 2, characterized in that the dielectric layer includes an embedded conductive layer.

20. Element for interconnecting at least two conductors of an integrated microelectronic circuit, comprising:
    a lower conductor;
    a dielectric layer on said lower conductor, the dielectric layer having a cavity between a top portion of the dielectric layer and the lower conductor, the cavity having a first length dimension;
    an upper conductor at least partially on the top portion of the dielectric layer and positioned at least partially above the cavity, the upper conductor having a second length dimension and forming a bridge above the lower conductor,
    wherein the first length dimension of the cavity is greater than the second length dimension of the upper conductor to define a plurality of vents adjacent to the upper conductor at the top portion of the dielectric layer, wherein the vents are in communication with the cavity to allow gas to pass into and out of the cavity, characterized in that a catalyst layer favoring the growth of carbon nanotubes is formed on an upper face of said lower conductor, and characterized in that an electrical contact layer is formed directly under the upper conductor, the upper conductor being deposited on the electrical contact layer.

21. Element for interconnecting at least two conductors of an integrated microelectronic circuit, comprising:

a lower conductor;

a dielectric layer on said lower conductor, the dielectric layer having a cavity between a top portion of the dielectric layer and the lower conductor, the cavity having a first length dimension;

an upper conductor at least partially on the top portion of the dielectric layer and positioned at least partially above the cavity, the upper conductor having a second length dimension and forming a bridge above the lower conductor, wherein the first length dimension of the cavity is greater than the second length dimension of the upper conductor to define a plurality of vents adjacent to the upper conductor at the top portion of the dielectric layer, wherein the vents are in communication with the cavity to allow gas to pass into and out of the cavity, characterized in that a catalyst layer, favoring the growth of carbon nanotubes, is formed on a lower face of said upper conductor, and characterized in that an electrical contact layer is deposited on the lower conductor.

* * * * *